US006259271B1

(12) United States Patent
Couts-Martin et al.

(10) Patent No.: US 6,259,271 B1
(45) Date of Patent: Jul. 10, 2001

(54) CONFIGURATION MEMORY INTEGRATED CIRCUIT

(75) Inventors: Chris Couts-Martin, San Jose; Alan Herrmann, Sunnyvale, both of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/595,579

(22) Filed: Jun. 15, 2000

Related U.S. Application Data

(63) Continuation of application No. 08/893,231, filed on Jul. 15, 1997, now Pat. No. 6,097,211.
(60) Provisional application No. 60/022,132, filed on Jul. 18, 1996.

(51) Int. Cl.[7] .......................... H03K 19/177; G01R 31/28
(52) U.S. Cl. ........................ 326/40; 326/41; 365/230.06; 714/725
(58) Field of Search ................................. 326/39, 40, 41; 714/725, 726, 727; 365/230.06, 230.08

(56) References Cited

U.S. PATENT DOCUMENTS

| Re. 34,363 | 8/1993 | Freeman | 307/465 |
|---|---|---|---|
| 4,170,927 | 10/1979 | Miller | 371/15 |
| 5,282,271 | 1/1994 | Hsieh et al. | 395/275 |
| 5,325,368 | * 6/1994 | James et al. | 371/22.3 |
| 5,336,950 | 8/1994 | Popli et al. | 307/465 |
| 5,489,858 | 2/1996 | Pierce et al. | 326/38 |
| 5,491,666 | 2/1996 | Sturges | 365/201 |
| 5,590,305 | 12/1996 | Terrill et al. | 395/430 |
| 5,650,734 | 7/1997 | Chu et al. | 326/38 |
| 5,689,516 | 11/1997 | Mack et al. | 371/22.2 |
| 5,694,399 | 12/1997 | Jacobson et al. | 371/22.3 |
| 5,706,424 | 1/1998 | Whittaker et al. | 395/185.07 |
| 5,710,550 | 1/1998 | Hsieh et al. | 340/825.79 |
| 5,734,868 | 3/1998 | Curd et al. | 395/500 |
| 5,737,567 | 4/1998 | Whittaker et al. | 395/340 |
| 5,805,197 | 9/1998 | Fleming et al. | 347/237 |
| 5,841,867 | 11/1998 | Jacobson et al. | 380/25 |
| 5,870,410 | 2/1999 | Norman et al. | 371/22.2 |
| 5,878,051 | 3/1999 | Sharma et al. | 371/22.1 |

FOREIGN PATENT DOCUMENTS

| 0 511 752 | 11/1992 | (EP) | G06F/11/26 |
|---|---|---|---|
| 0 639 006 | 2/1995 | (EP) | H03K/19/173 |
| 2 267 767 | 12/1993 | (GB) | G06F/9/445 |
| WO 92/20157 | 11/1992 | (WO) | H03K/19/177 |

OTHER PUBLICATIONS

"In System Programmability in MAX 9000 Devices," *Altera Corporation—1995 Data Book*, Appl. Brief 141, Ver. 1, pp. 1–8 (Jun. 1995).

"Configuring Flex 10K Devices," *Altera Corporation—1995 Data Book*, Appl. Note 59, Ver. 1, pp. 1–24 (Dec. 1995).

"Designing for In–System Programmability in MAX 7000S Devices," *Altera Corporation—1995 Data Book*, Appl. Brief 145, Ver. 1, pp. 1–8 (Jun. 1995).

(List continued on next page.)

*Primary Examiner*—Michael Tokar
*Assistant Examiner*—Daniel D. Chang
(74) *Attorney, Agent, or Firm*—Townsend and Townsend and Crew LLP

(57) ABSTRACT

A configuration memory for storing information which is in-system programmable. The programming of the configuration memory may be performed using JTAG (IEEE Standard 1149.1) instructions. Furthermore, the configuration of a programmable logic device using the configuration data in the configuration memory may be initiated with a JTAG instruction. Pull-up resistors are incorporated within the configuration memory package.

9 Claims, 7 Drawing Sheets

OTHER PUBLICATIONS

"IEEE Standard Test Access Port and Boundary–Scan Architecture," *Institute of Electric and Electronic Engineers, Inc.*, IEEE Std. 1149.1–1990, pp. 1–1 to 12–2 and A–1 to A–12 (Oct. 1993).

"Supplement to IEEE Std. 1149.1–1990, IEEE Standard Test Access Port and Boundary–Scan Architecture," *Institute of Electric and Electronic Engineers, Inc.*, IEEE Std. 1149–1b–1994, pp. 1–66 (Mar. 1995).

"Flex 10K, Embedded Programmable Logic Family," *Altera Corporation—1996 Data Book*, Ver. 2, pp. 31–90 (Jun. 1996).

"Flex 8000, Programmable Logic Device Family," *Altera Corporation—1996 Data Book*, ver. 8, pp. 93–153 (Jun. 1996).

"The Programmable Logic Data Book, XC 17000 Family of Serial Configuration PROMs," *Xilinx*, pp. 2–229 to 2–240 (1994).

"The Programmable Logic Data Book, Boundary Scan in XC4000 Devices," *Xilinx*, pp. 8–45 to 8–59 (1994).

Am29LV800T/Am29LV800B, 8 Megabit (1,048,576 x 8–Bit/524,288 x 16–Bit) CMOS 3.0 Volt–only, Sectored Flash Memory, *Advanced Micro Devices—Publication #20478*, Rev. A, pp. 1–45 (Jan. 1996).

Am29F200T/Am29F200B, 2 Megabit (262,144 x 8–Bit/131,072 x 16–Bit) CMOS 5.0 Volt–only, Sector Erase Flash Memory, *Advanced Micro Devices—Publication #18608*, Rev. B, pp. 1–66 to 1–99 (Nov. 1995).

"4,096–Bit Series Electrically Erasable PROM with 2V Read Capability," *EXEL Microelectronics, Inc.*, pp. B–1 to B–11 (Feb. 1996).

"64K 5.0V CMOS Smart Serial™ EEPROM," *Microchip Technology, Inc.*, pp. C–1 to C–12 (1995).

"Serial Access Mirowire Bus 4K (256 x 16 or 512 x 8) EEPROM," *SGS–Thomson Microelectronics*, pp. D–1 to E–14 (Jun. 1995).

"2–MBIT (128K x 16, 256K x 8) Low–Power Boot Block Flash Memory Family," *Intel Corporation*, pp. 1–54 (Dec. 1995).

"Configuration Memories Support SRAM FPGAS," *Electronic Design*, vol. 43, No. 25, p. 148 (Dec. 1995).

"FPGS Configuration $E^2$ PROM 65K, 128K and 256K," *ATMEL*, pp. A–2 to A–8 and 3–11 to 3–17 (date not printed, estimated publish date of 1995.

* cited by examiner

CONFIGURATION MEMORY INTEGRATED CIRCUIT

This application is a continuation of and claims the benefit of U.S. patent application Ser. No. 08/893,231, filed Jul. 15, 1997 now U.S. Pat. No. 6,097,211, which claims the benefit of U.S. application Ser. No. 60/022,132, filed Jul. 18, 1996, the disclosures of which are incorporated herein by reference.

This application claims the benefit of Provisional Application Ser. No. 60/022,132, filed Jul. 18, 1996, incorporated herein by reference.

BACKGROUND OF THE INVENTION

This invention relates generally to integrated circuits and techniques for configuring integrated circuits. In particular, the invention relates to a configurable memory that is particularly useful for storing information used in the configuration of programmable logic devices (PLDs). For example, the invention provides a device capable of interfacing with the Altera Flex™ 10K and FleX™ 8K lines of PLDs. However, a device designed using the principles of the present invention will find beneficial use in storing information for a variety of purposes and interfacing with a variety of devices.

PLDs are well known in the industry. They allow designers to use off-the-shelf parts to perform specialized logic functions. A PLD is an integrated circuit which may be customized by the designer for different logical functions. As such, PLDs combine the logistical advantages of standard, fixed, integrated circuits, with the architectural flexibility of custom-made devices. By using these devices, custom logic functions can be designed and fabricated in-house, while eliminating the long engineering lead times, high tooling costs, complex procurement logistics and dedicated inventory problems associated with custom devices. Furthermore, the design can be easily changed without upsetting design schedules and purchase agreements.

When a typical PLD is supplied by an integrated circuit manufacturer, it is not yet capable of performing any specific function. The device must first be configured. PLDs often comprise a plurality of generic logic blocks which may be arbitrarily programmed and interconnected to each other. Often, they are implemented using volatile memory such as an SRAM. Volatile memory loses its configuration upon termination of power to the system. Alternatively, a PLD may be implemented with nonvolatile memories such as Erasable Programmable Read Only Memories (EPROMs), Electronically Erasable Programmable Read Only Memories (EEPROMs), fuses, and antifuses which retain their configuration upon termination of power.

If the programmable elements used are volatile memories, the memory cells must be configured upon system power-up in order for the device to operate as desired. This is typically done by loading configuration data from an external source into the PLD. The external source may be, for example, a nonvolatile memory. Often, the configuration data is stored in a configuration memory. A configuration memory is a memory capable of storing information. Configuration of the PLD is accomplished by transferring the configuration data from the configuration memory to the PLD. Another method of performing the configuration is to transfer the data from external memory by means of an intelligent host such as a CPU, system controller, and the like.

The present invention recognizes that an improved configuration memory is desirable. As programmable logic devices and the systems within which they operate become more complex, the configuration memories, and techniques for using them must improve. Today's programmable logic devices are becoming larger and more complex. Consequently, more configuration data is needed to configure them. Speed and flexibility of the configuration process is becoming of increasing concern. Furthermore, new techniques for configuring the devices require advances over the current state of the art in configuration memories.

There is thus a need for an improved configuration memory.

SUMMARY OF THE INVENTION

The present invention provides a configuration memory for use in storing information The configuration memory comprises a memory array in which the information is stored, a data-out port through which the information is transferred, and JTAG circuitry capable of receiving one of a group of JTAG instructions from a JTAG port and controlling operation of the configuration memory according to the JTAG instructions. The JTAG port is defined by the Joint Test Action Group interface standard (JTAG Standard). The JTAG standard is described in IEEE Standard 1149.1-1990, *IEEE Standard Test Access Port and Boundary-Scan Architecture*, which is incorporated herein by reference for all purposes.

In a preferred embodiment, the information stored in the configuration memory is configuration data for use in configuring a programmable logic device.

In another preferred embodiment, resistors are provided within a common physical package with the configuration memory to hold some of the control signals at a desired logic level. These resistors are able to be selectively decoupled from the system to allow backward compatibility with previous devices.

A method for configuring a programmable logic device is also provided. The method includes the steps of providing a configuration memory which has a memory array and JTAG circuitry capable of receiving one of a group of JTAG instructions from a JTAG port and controlling operation of the configuration memory according to the JTAG instructions, programming the memory array with configuration data, and transferring the configuration data to the programmable logic device. In a preferred embodiment of the present invention, the configuration memory is programmed by having data transferred to it through the JTAG port. Another preferred embodiment transfers data from the configuration memory to the programmable logic device upon receipt of a JTAG instruction.

A method for programming a configuration memory in-system is also provided. The method includes the steps of sending a JTAG instruction to the JTAG port of the configuration memory and transferring the configuration data into the memory array of the configuration memory through a JTAG port.

A further understanding of the nature and advantages of the inventions herein may be realized by reference to the remaining portions of the specification and the attached drawings.

DESCRIPTION OF THE SPECIFIC EMBODIMENTS

Figure 1:
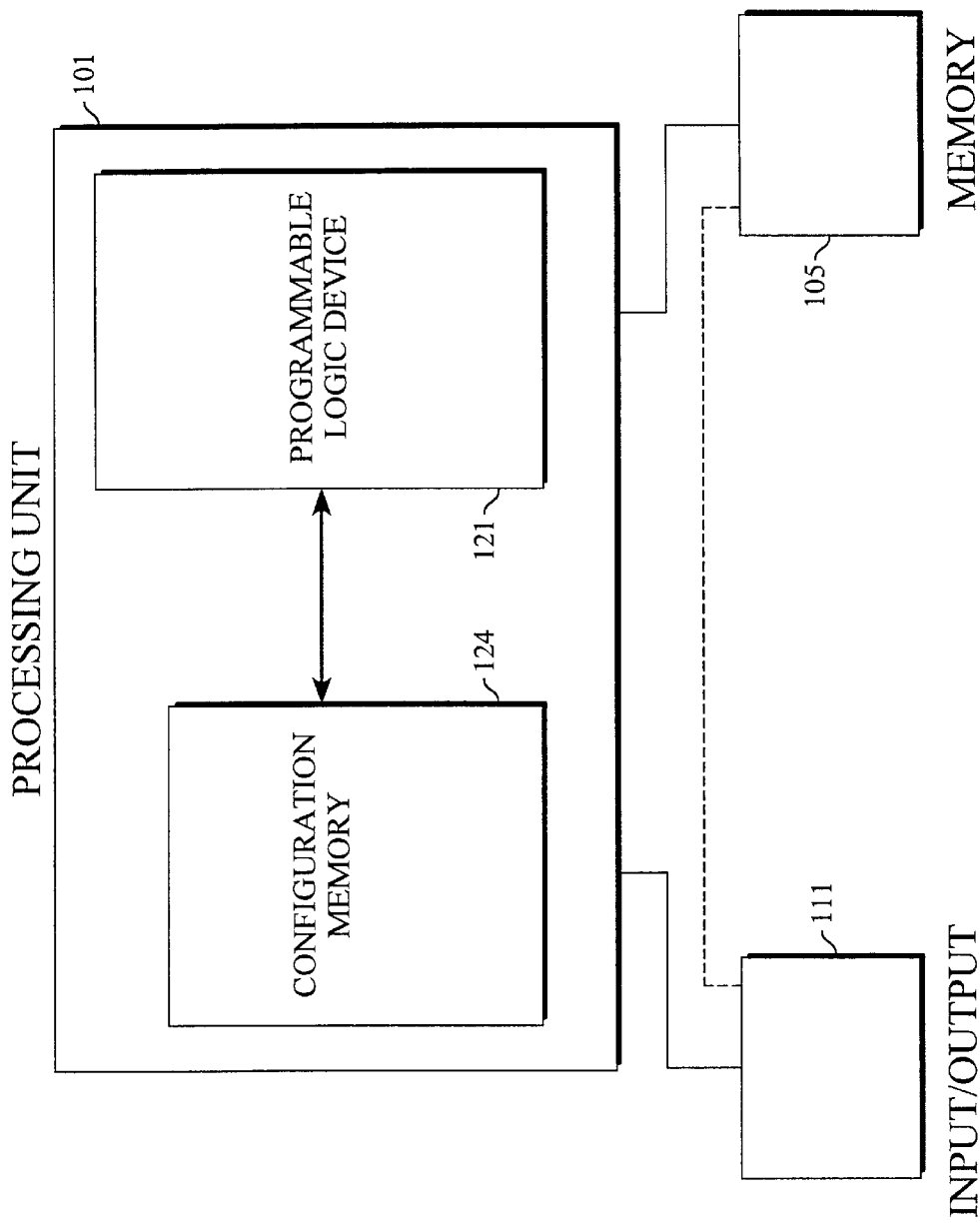
FIG. 1 is a block diagram of a digital system containing a configuration memory.

FIG. 1 illustrates a typical environment in which the present invention may be embodied. A digital system has a processing unit 101 which is coupled with a memory 105 and an input/output device 111. A personal computer is an example of such a digital system. However, a wide variety of electronic and consumer products will find beneficial use from the present invention. The present invention will find application in telecommunications, switches, networks, and many other areas of technology.

The digital system of FIG. 1 contains one or more programmable logic devices 121 and configuration memories 124 of the type described in the present invention. In FIG. 1, programmable logic device 121 and configuration memory 124 are shown as a part of processing unit 101. However, memory 105 or input/output device 111 may also contain programmable logic device 121 and configuration memory 124.

The digital system shown may be embodied on a single board, on multiple boards, or even within multiple enclosures. For example, configuration memory 124 may be in an entirely difference location from programmable logic device 121 and connected by a network. Furthermore, the digital system may comprise any multiple or combination of the elements shown. For example, the digital system may have multiple processing units 101, or have no processing unit 101 at all. One of the advantages of programmable logic device 121 is it logical flexibility. Consequently, one with skill in the art can readily envision many applications for utilizing such a device within a variety of digital systems.

Figure 2:
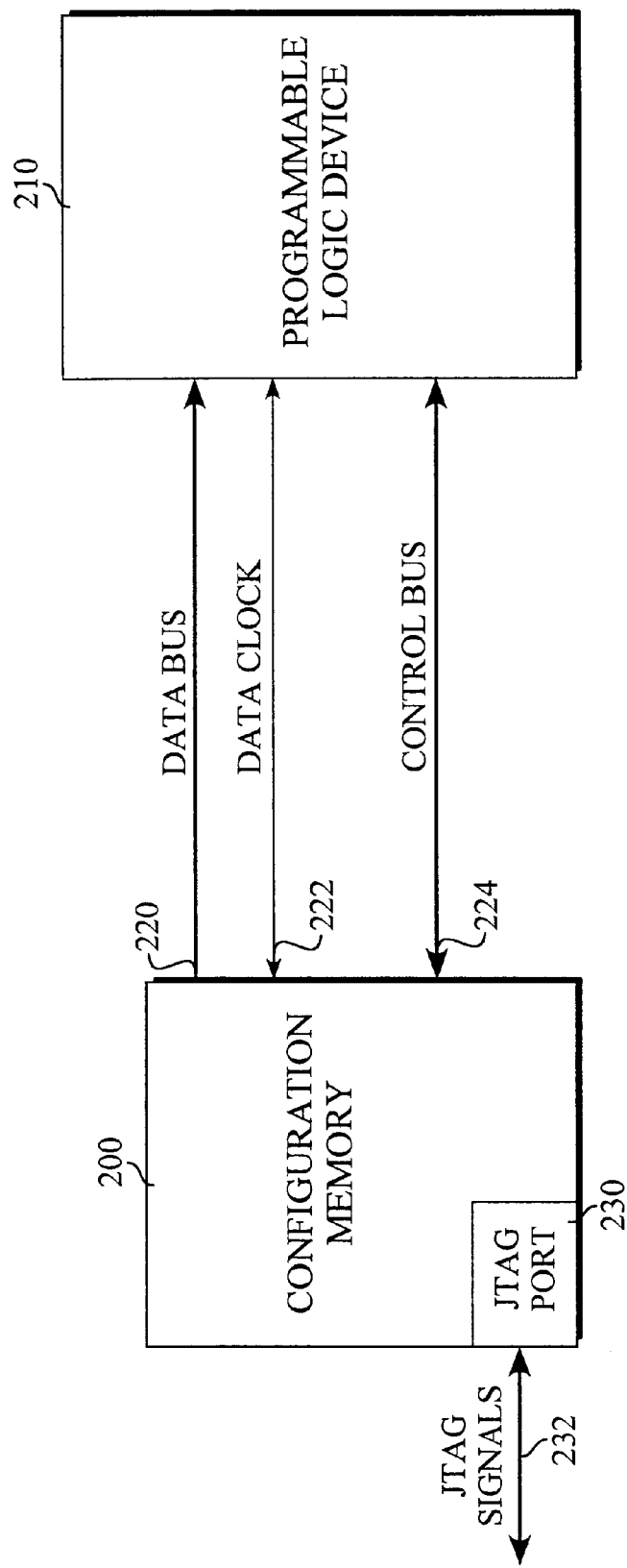
FIG. 2 is a block diagram of a configuration memory and programmable logic device coupled together.

Referring to FIG. 2, the use of a configuration memory 200 of the present invention in connection with a programmable logic device 210 is depicted. Configuration memory 200 contains configuration data for use in configuring programmable logic device 210 to perform desired logic functions. Programmable logic device 210 is often a device comprising volatile cells which do not hold their value when the machine is powered off. Therefore, upon power-up of the machine, or if programmable logic device 210 is to be reconfigured, configuration data must be loaded into programmable logic device 210. Configuration memory 200 holds this configuration data.

The configuration data is transferred from configuration memory 200 via data bus 220 to programmable logic device 210. The transfer operation is synchronized by a data clock 222 which may be supplied from configuration memory 200, programmable logic device 210 or other devices. If configuration memory 200 provides data clock 222 to the system, it is referred to as a master. If configuration memory 200 receives data clock 222 from an outside device it is referred to as a slave.

Additionally, a control bus 224 exists between configuration memory 200 and programmable logic device 210. Control bus 224 provides handshaking signals between the two devices 200 and 210. The handshaking signals provide each device with information about when to begin its operations and when the other device has completed its operations. The details of control bus 224 will be discussed in further detail below.

A feature of the present invention on configuration memory 200 is a JTAG Port 230. JTAG Port 230 allows configuration memory 200 to be accessed via a serial, industry-standard protocol. The structure of the JTAG port, along with the protocol associated with the use of the JTAG port is described the JTAG standard which is referenced above.

Figure 3:
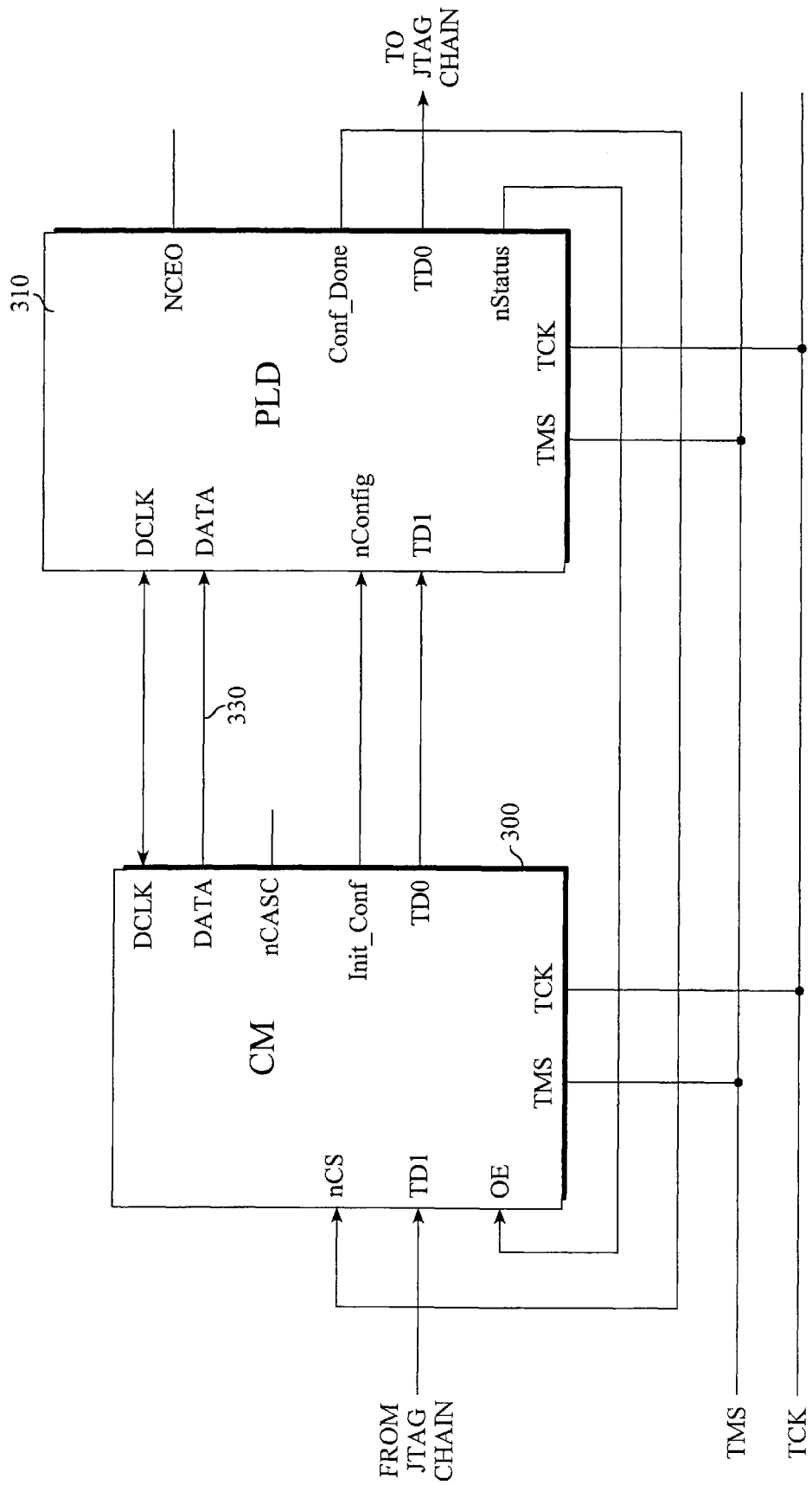
FIG. 3 is a more detailed block diagram depicting the interface lines between a configuration memory and a programmable logic device.

Many techniques may be used in configuring a programmable logic device using the configuration memory of the present invention. Some examples of configuration techniques are described in U.S. Pat. No. 5,590,305, which is incorporated herein by reference for all purposes. FIG. 3 shows an example of one technique. FIG. 3 shows a single serial configuration memory 300 coupled with a single programmable logic device 310. Serial configuration memory 300 has a data clock (DCLK), a data port 330, control lines, and a JTAG Port.

In one embodiment of the present invention, the control lines may be comprised, for example, of four separate lines, one control line is an initialize configuration line (INIT-CONF). INIT-CONF is an output from serial configuration memory 300. It is driven low when serial configuration memory 300 is ready to begin to configure programmable logic device 310. This alerts programmable logic device 310 to prepare to receive data.

When it is ready to receive data, programmable logic device 310 drives a chip select line (nCS) of serial configuration memory 310 low. The nCS line is driven low throughout the configuration process. At other times, nCS is held at a high logic level. Upon assertion of nCS, serial configuration memory 300 begins shifting data out one bit at a time on data port 330. This data shifting continues until all data in configuration memory 300 has been transferred to programmable logic device 310.

When the data transfer is complete, configuration memory 300 asserts another control line referred to as a cascade line (nCASC). The nCASC line is an output which signals that configuration memory 300 has exhausted all of its configuration data. The nCASC line is useful for stringing together multiple configuration memories. This technique will be described below. In FIG. 3, since there are no other configuration memories, nCASC is left unconnected.

The final control line of configuration memory 300 is the output enable line (OE). The purpose of OE is to enable configuration memory 300. When an error occurs in the configuration, configuration memory 300 is disabled. Consequently, when programmable logic device 310 experiences an error during configuration, it drives OE low. Configuration memory 300, upon seeing OE go low, resets its registers and begins the configuration process over again.

The control lines of the JTAG Port are also shown in FIG. 3. The JTAG port comprises four control signals which are defined in the JTAG Standard. The JTAG input signals include a test data input line (TDI), a test mode select line (TMS), and a test clock (TCK). A test data output line (TDO) is also provided. The JTAG port operates by serially shifting data in on the TDI line and serially shifting data out on the TDO line. The TCK line provides a clock which synchronizes the operation. The TMS line is manipulated to cause the JTAG port to switch among its various operating states.

Figure 4:
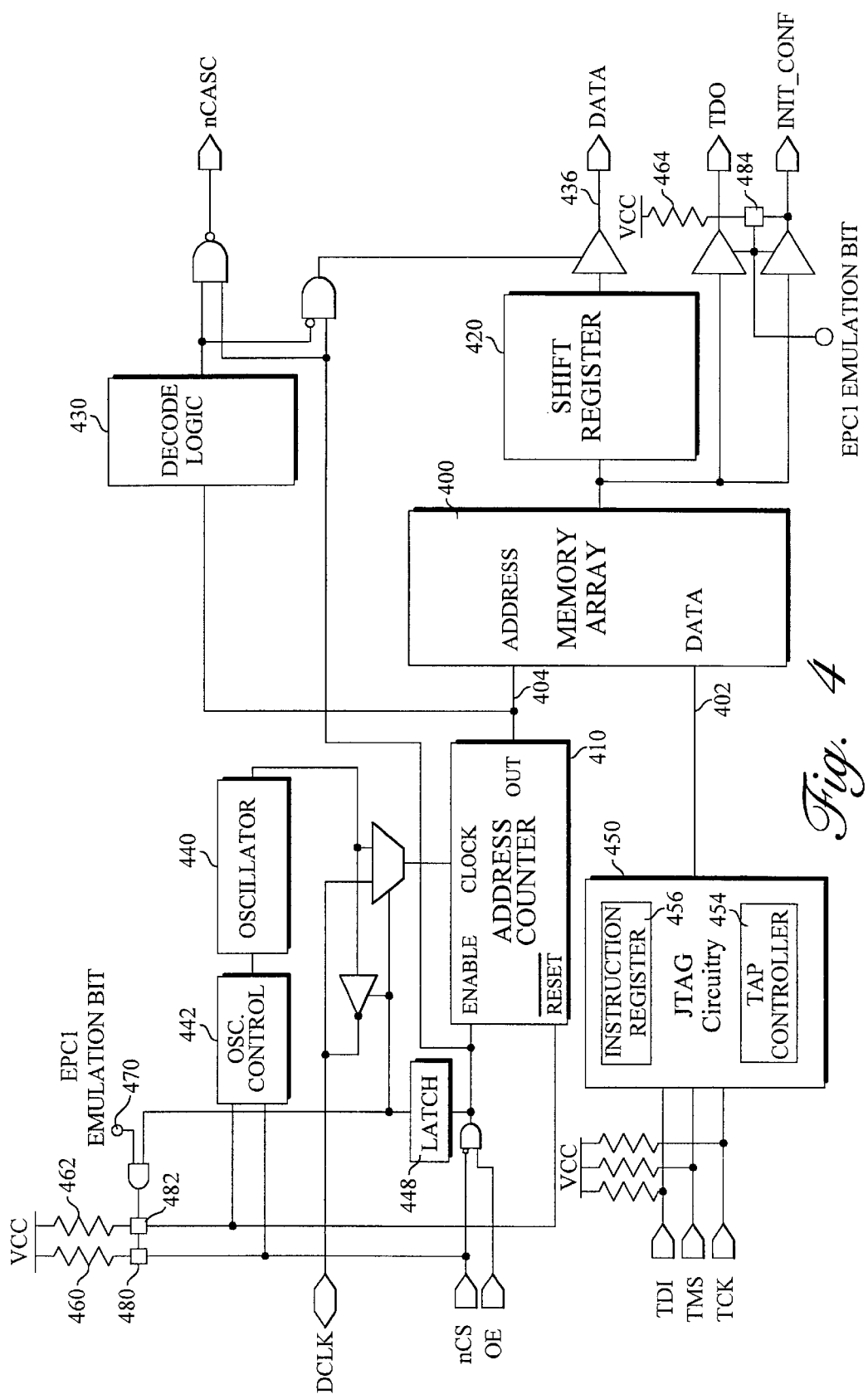
FIG. 4 is a more detailed diagram of a configuration memory of the present invention.

FIG. 4 shows a more detailed diagram of a preferred embodiment of configuration memory 300. In a preferred embodiment, the components shown in FIG. 4 are fabricated on a single semiconductor substrate. The configuration data is stored in a memory array 400. Memory array 400 is arranged as a random access memory, with a data input 402 and an address input 404. Memory array 400 may be comprised of, for example, EPROM, EEPROM, Flash, antifuse, fuse, SRAM or other types of memory cells. It may also be a combination of memory cell types. The address for address input 404 is provided by an address counter 410. Memory array 400 may be one bit wide for serial operation, or multiple bits wide for parallel operation. These two types of operation will be discussed below.

Address counter 410 is reset to an initial value, for example, all zeros, when OE is not asserted. It is enabled when nCS is asserted and OE is asserted. Address counter 410 is driven by a data clock (DCLK). That is, when configuration memory 300 is enabled, address counter 410 is incremented once for every clock cycle. By this method, memory array 400 is sequentially accessed at each memory location. When a memory location is accessed by address counter 410, the data at that location is stored in a shift register 420. From shift register 420, configuration data is shifted out of configuration memory 300 to the programmable logic device.

Decode logic 430 is included to determine when the configuration data has been completely exhausted from memory array 400. Decode logic 430 references the output of address counter 410 and determines when memory array 400 is out of data. It may accomplish this by comparing the current address with the address of the last piece of information stored in memory array 400. When memory array 400 is out of data, nCASC 434 is asserted, and the data output line 436 is tristated.

The data clock line (DCLK) is a bidirectional terminal. It has two operating modes. In one operating mode, configuration memory 300 is a master. That is, DCLK is supplied from an oscillator 440 within configuration memory 300. Oscillator 440 is controlled by oscillator control logic 442 which receives input from ncS line and OE. When operating as a master, the clock for address counter 410 and DCLK are both supplied from oscillator 440.

The second mode of operation for the configuration memory 300 is as a slave. When operating as a slave, DCLK is supplied from an external device. For example, the clock may be supply from an external programmable logic device, or another configuration memory in the same system. When in slave mode, the output from oscillator 440 is tristated to isolate oscillator 440 from DCLK. In the slave mode, DCLK operates as an input to configuration memory 300.

In a preferred embodiment, the determination of whether configuration memory 300 operates as a master or a slave is determined at power up. This information is stored in a latch 448. Latch 448 stores the initial state of nCS and OE. If ncS is low and OE is high at power up, then configuration memory 300 is the master. Otherwise, it is a slave. configuration memory 300 also contains JTAG circuitry 450. JTAG circuitry 450 receives TDI, TMS and TCK as inputs. A TAP controller 454 is provided in the JTAG circuitry 450. TAP controller 454 is a synchronous finite state machine that responds to changes at the TMS and TCK signals and controls the sequence of operations of the JTAG circuitry. Its operation is described in the JTAG standard.

An instruction register 456 is also provided in JTAG circuitry 450. Instruction register 456 is loadable only during certain states of TAP controller 454. During other states, JTAG circuitry 450 acts upon instruction in instruction register 456.

The memory cells of memory array 400 are daisy-chained together to form one or more JTAG test data registers. The first element in the JTAG test data register is coupled to TDI. The final element in the JTAG test data register is connected to an external line on configuration memory 300. This is TDO.

By placing TAP controller 454 into the proper state and loading the correct instruction into instruction register 456, data is serially scanned into the memory cells of memory array 400 through the JTAG test data register. In this manner, memory array 400 may be programmed with configuration data. The programming of memory array 400 may be accomplished while the configuration memory is located within the system it resides. This is referred to as in-system programming (ISP). Details of the instruction register, the instruction set and the JTAG controller state machine are available in the JTAG standard.

The configuration data for configuration memory 300 may be supplied by external software. For example, Altera's MAX+PLUS II software, available from Altera Corporation in San Jose, Calif., may be used to implement the desired logic functions for one or more programmable logic devices. The MAX+PLUS II software generates the configuration data for implementing the design. This configuration data is used for programming the programmable logic device. The configuration data may be stored in a memory such as, but not limited to, random access memory, cache memory, magnetic media, hard disk drives, floppy disks, CD ROMs, and many others. A preferred type of configuration data is stored in a standard configuration file format known in the industry as an "SVF" file. For example, an SVF files may be stored on a floppy disk. The SVF file may be transferred into a configuration memory of the present invention through a cable from a computer.

An additional output terminal, INIT-CONF, is an output signal from configuration memory 300 which indicates when configuration memory 300 is ready to begin a transfer of configuration data. In an embodiment of the present invention, INIT-CONF is coupled with one of the cells of memory array 400. A JTAG instruction, for example, a private JTAG instruction may be sent to JTAG circuitry 450 to cause INIT_CONF to be asserted. The JTAG instruction may be loaded into instruction register 456. JTAG circuitry loads data into the cell causing INIT_CONF to be asserted. In another embodiment, configuration memory 300 has separate circuitry outside of memory array 400 which is manipulated by the private JTAG instruction to assert INIT-CONF.

The nCS signal may be asserted at a low logic level and OE may be asserted at a high logic level. That is, nCS is driven low and OE is held high when configuration memory 300 is to be selected. OE is driven low the when an error has occurred, and configuration memory 300 is disabled. At other times, these inputs may be held at a high logic level. The inputs are held high by resistor 460 and 462 which are located between VCC and the input signal. In previous configuration memories, a resistor was placed external to the configuration memory between VCC and the input signal.

In one embodiment of the present invention, a resistor 460 is located between VCC and nCS line and another resistor 462 is placed between VCC and OE. These resistors 460 and 462 are located within a common physical package (i.e. fabricated on the same semiconductor substrate) as memory array 400 in the configuration memory package. This has the advantage of reducing the number of external resistors and eliminating all of the accompanying space requirements and wiring needs that go along with external resistors. This reduces the number of parts needed, and the number of parts which have the possibility of failure or damage. Furthermore, the designer need not worry about determining the proper size of resistor needed for a design.

Similarly, INIT-CONF is driven low when configuration memory 300 signals the programmable logic device to begin a configuration cycle. When it is not asserted, it is held at a high logic level. To hold it at a high logic level, a resistor 464 is placed between VCC and INIT-CONF. In the past, resistors were placed external to the chip. In an embodiment of the present invention, resistor 464 is located within the chip package thereby providing all the advantages listed above.

In order to be backward compatible with devices used in the past, the configuration memory of the present invention provides an emulation bit 470. When the emulation bit 470 is set, resistors 460, 462 and 464 on nCS, OE, and INIT-CONF are decoupled from the circuit by programmable switches 480, 482, and 484. Furthermore, since previous devices did not have a JTAG interface, a TDO output line, or an INIT-CONF output, these outputs are placed in a tristated condition when emulation bit 470 is set. With emulation bit 470 set, the device of the present invention can be used interchangeably with previously available configuration memories without a redesign of the system.

Programmable switches 480 and 482 may also decouple resistors 460 and 462 from the system when configurable memory 300 is operating as a slave.

The present invention is not limited to only the technique of configuring a single serial configuration memory and a single programmable logic device. Other techniques utilizing the principles of the present invention are also provided. For example, a system may operate with a serial configuration memory and multiple programmable logic devices, multiple serial configuration memories and a single programmable logic device, or multiple serial configuration memories and multiple programmable logic devices.

Furthermore, the configuration memory may operate as a parallel device with multiple data output lines. In this case, multiple programmable logic devices may be coupled to a single configuration memory or multiple programmable logic devices may be coupled with multiple configuration memories.

Figure 5:
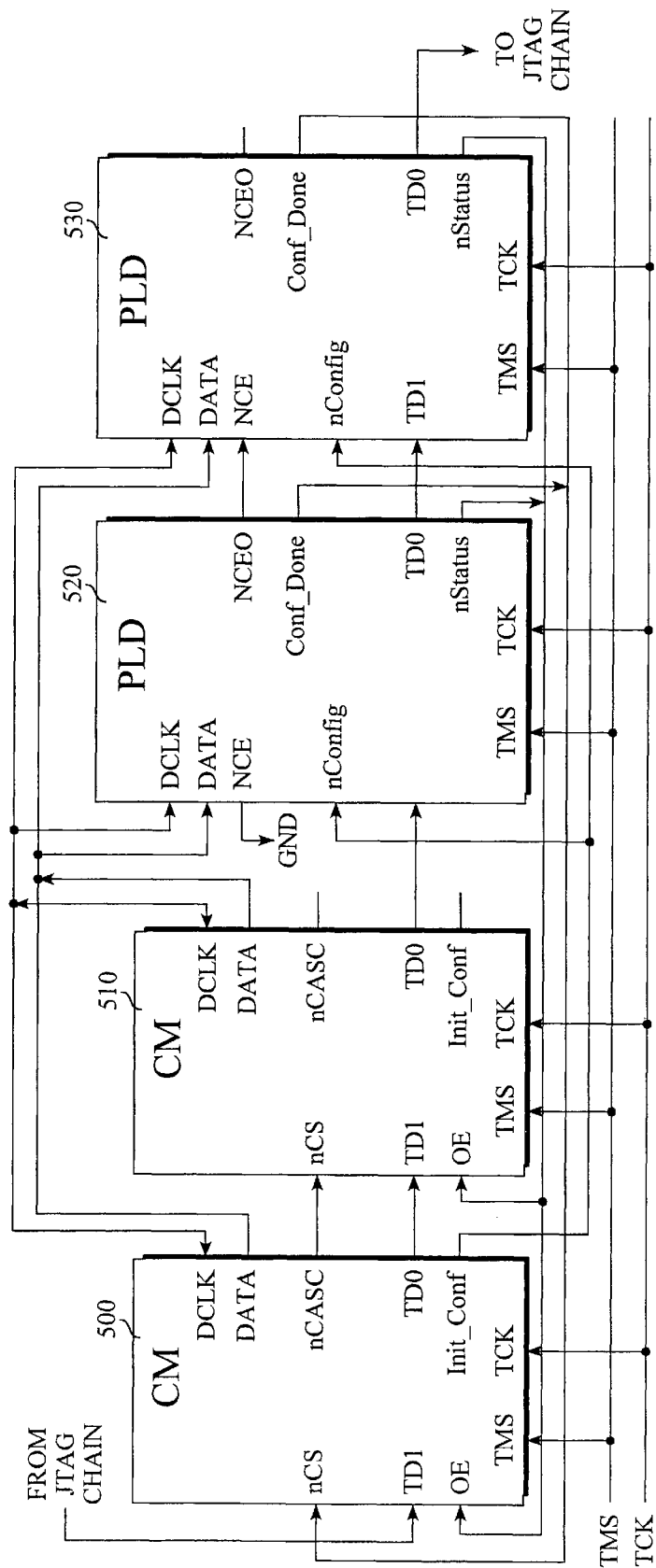
FIG. 5 is a block diagram of a technique for serially configuring multiple programmable logic devices using multiple configuration memories.

FIG. 5 shows multiple serial configuration memories 500 and 510 and multiple programmable logic devices 520 and 530. Configuration memories 500 and 510 hold the configuration data for both programmable logic devices 520 and 530. First configuration memory 500, begins outputting it data into first programmable logic device 520 until either configuration memory 500 runs out of configuration data or first programmable logic device 520 becomes completely configured. If first configuration memory 500 runs out of data, then second configuration memory 510 begins outputting data. When first programmable logic device 520 is fully configured, then second programmable logic device 530 begins accepting data. The handshaking of the control signals is similar to that described above. The nCASC signal from first configuration memory 500 is coupled with nCS of second configuration memory 510. When first configuration memory 500 is out of data, nCASC is asserted and second configuration memory 510 begins outputting data. When first programmable logic device 520 is completely configured, it drives the status line (nCEO) low. This indicates that second programmable logic device 530 may begin accepting data.

As many configuration memories and programmable logic devices as are needed in a system may be chained together in this fashion. If either of the programmable logic devices 520 or 530 have an error during the configuration process, the nSTATUS line of programmable logic device 520 or 530 is asserted. nSTATUS is connected to OE of configuration memories 500 and 510. This resets the entire system and the configuration process starts over from the beginning.

The data clock, DCLK, for the system is provided either by one of the configuration memories, for example, first configuration memory 500, or from one of the programmable logic devices, for example, first programmable logic device 520. Only one of the devices is used as a master for the data clock. The other devices are be placed in slave mode.

As mentioned above, the configuration memory may also be used in a parallel operation. Referring to FIG. 4, memory array 400, rather than being only one-bit wide, may be multiple-bits wide. Instead of a single data out line 436, multiple data out lines are provided. For each column of memory array 400, a separate data out line is provided. Shift register 420 loads data from memory array 400 and outputs the data one bit at a time on each of the multiple data out lines 436. After this fashion, a single configuration memory may be tied to multiple programmable logic devices.

Figure 6:
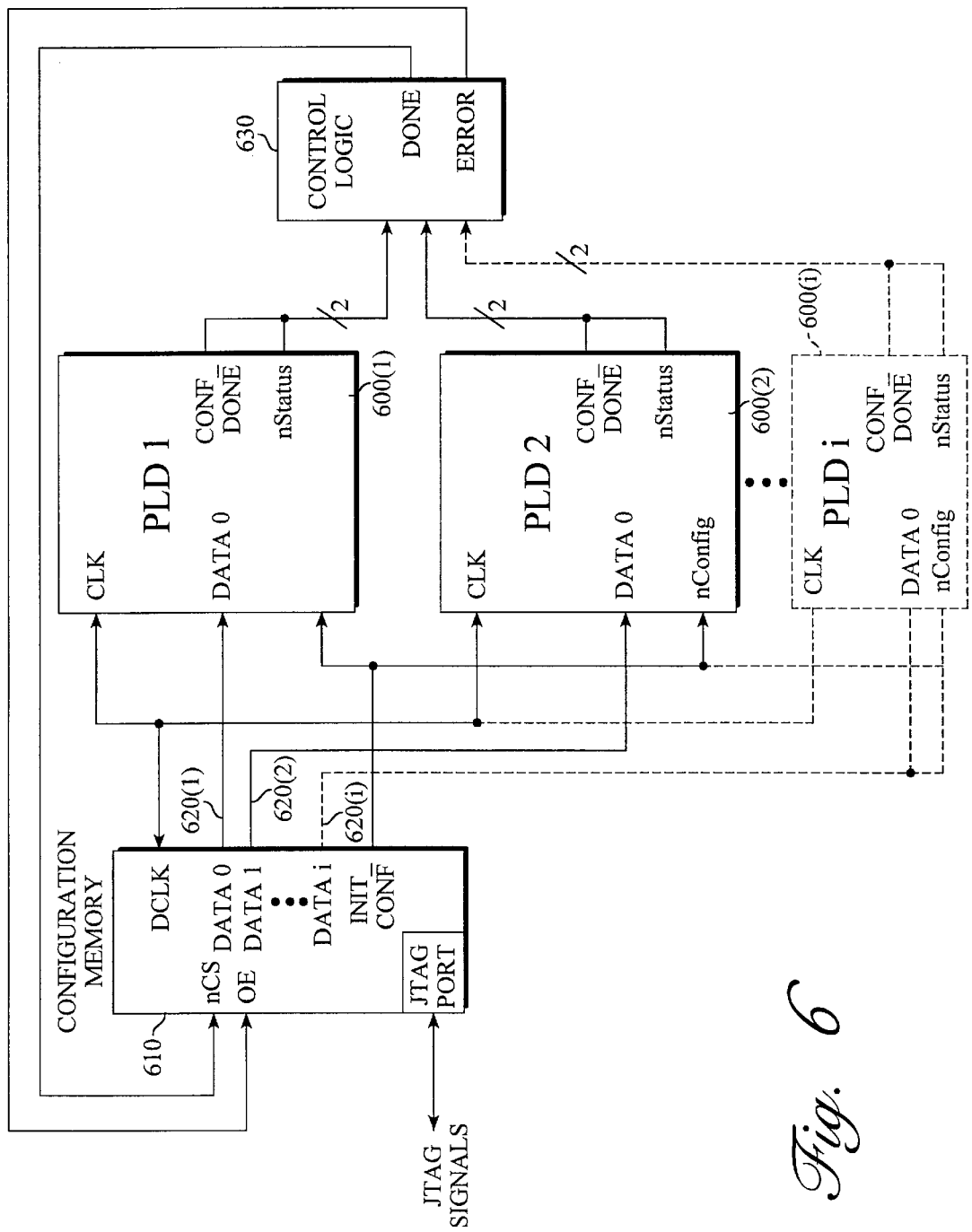
FIG. 6 is a block diagram of a technique for configuring multiple programmable logic devices in parallel.

FIG. 6 shows a series of programmable logic devices 600(1,2, . . . i) coupled with a single parallel configuration memory 610. The parallel configuration memory 610 has multiple data output lines 620(1,2, . . . i). Each individual data output line 620(i) is connected to a single programmable logic device 600(i). When configuration memory 610 is ready to begin configuration as described above, it asserts the INIT_CONF line which is connected with each programmable logic device 600. Then data is transferred in parallel to each of the programmable logic devices through their data input lines.

When the configuration for a programmable logic device is complete, the CONF_DONE line is raised. Control logic 630 determines when all the programmable logic devices are completely configured and if an error has occurred. This information is fed back to the configuration memory on the nCS and OE lines respectively.

The configuration of each of the programmable logic devices takes place simultaneously. If enough data cannot be held in a single configuration memory, multiple parallel configuration memories may be cascaded together. In this case, the first configuration memory outputs all of its data and then signals with nCASC for the second configuration memory to begin outputting its data to the programmable logic devices.

Figure 7:
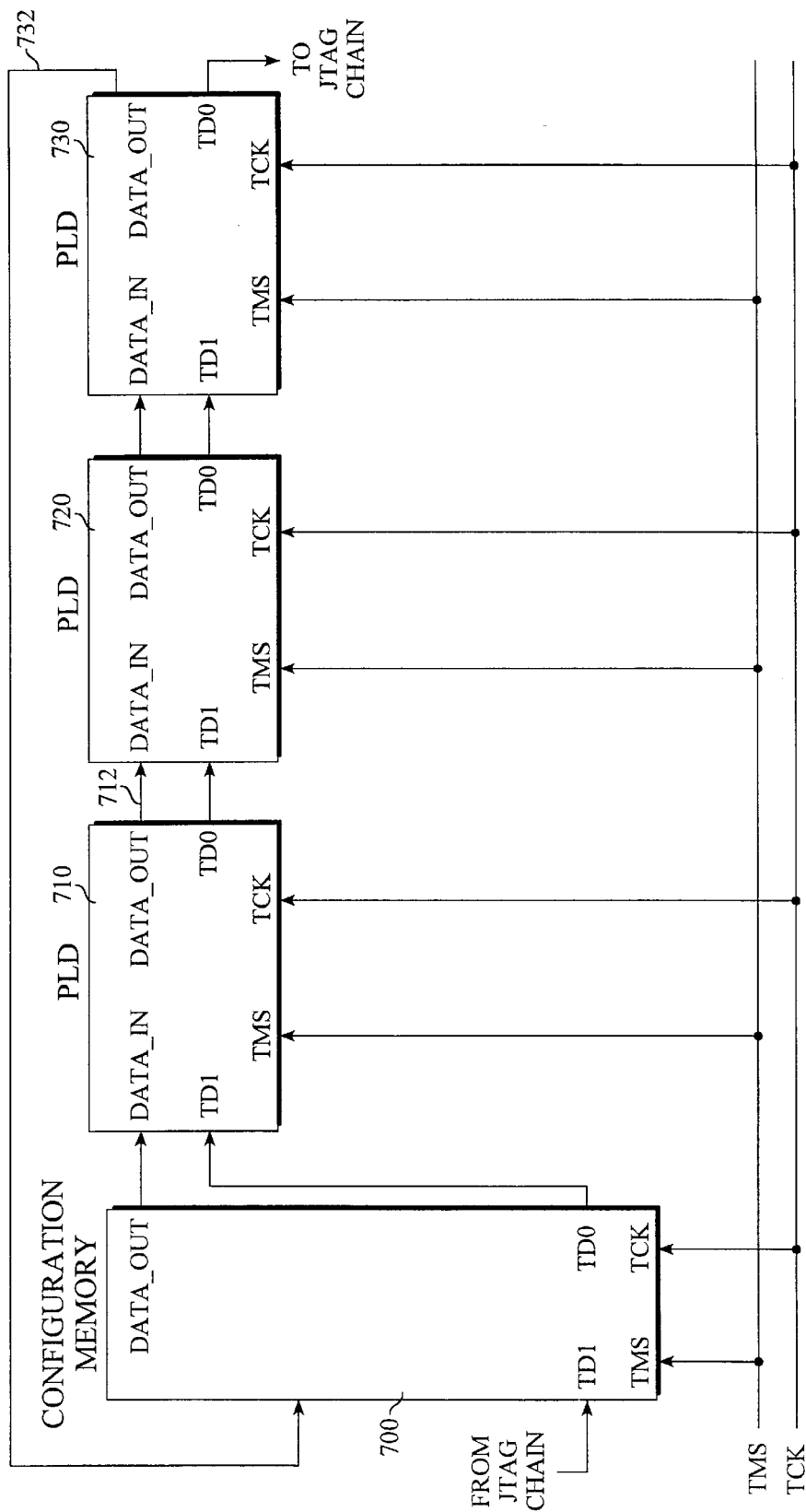
FIG. 7 is a block diagram of a technique for configuring multiple PLDs from a configuration memory by daisy chaining the PLDs together.

FIG. 7 shows a block diagram of another technique of using the configuration memory of the present invention to program multiple programmable logic devices. A serial configuration memory 700 (such as the configuration memory shown in more detail in FIG. 4) is coupled with a first programmable logic device 710. Configuration memory 700 has a JTAG port which is receptive to JTAG instructions through its TDI, TMS and TCK lines. Programmable logic device 710 is coupled with a second programmable logic device 720, which is coupled with a third programmable logic device 730 and so on. The resulting sequential chain.

(daisy-chain) of programmable logic devices may be extended as long as desired.

Configuration data from configuration memory 700 is shifted to first programmable logic device 710 as described above. However, first configuration memory 710 also has a configuration data output port. Data is shifted into first configuration memory 710. When it is full, rather than terminating the configuration process as described above, the data is shifted out on configuration data output port 712 to second programmable logic devices 720. The output from programmable logic device 720 is also connected to the input to programmable logic device 730. In this manner, any number of devices may be daisy-chained and data passed serially through them until configuration is complete. When programmable logic device 730 is completely configured, it asserts a control bit 732 which halts configuration memory 700.

Although several specific embodiments and techniques of using the present invention have been presented herein, the above embodiments are intended only as examples of the present invention. No limitations on the claims are intended or implied by the above examples. It can be easily recognized by one of skill in the art that the variations can be made to a particular structure or logic element described without departing from the scope and nature of the present invention. For example, logic levels may be switched, signal names may be changed or additional circuitry added to the design without changing the nature of it. Also, for example, other combinations of parallel and serial configuration memories may be used as configuration techniques.

What is claimed is:

1. A configuration memory for use in storing information comprising:

a substrate;

a memory array formed on the substrate for storing said information;

a data out port formed on the substrate and coupled with said memory array, wherein said information is transferable from said memory array out of said configuration memory through said data out port;

a JTAG port formed on the substrate and coupled with said memory array for receiving JTAG instructions; and JTAG circuitry formed on the substrate, said JTAG circuitry being capable of receiving one of a group of JTAG instructions from said JTAG port and controlling operation of said configuration memory according to said JTAG instruction.

2. The configuration memory of claim 1 wherein said memory array is programmable via said JTAG port.

3. The configuration memory of claim 1 wherein said memory array is in-system programmable.

4. The configuration memory of claim 1 wherein said information is configuration data for configuring a programmable logic device.

5. The configuration memory of claim 1 wherein said information is transferable responsive to receipt of said JTAG instruction.

6. The configuration memory of claim 1 wherein said memory array further comprises:

an output terminal, said output terminal being changed from a first logic state to a second logic state responsive to receipt of said JTAG instruction.

7. A method of programming a configuration memory having a memory array and JTAG circuitry formed on a single substrate and capable of receiving one of a group of JTAG instructions from a JTAG port and controlling operation of said configuration memory according to said JTAG instruction comprising the steps of:

sending said JTAG instruction to said JTAG port; and transferring configuration data to said memory array of said configuration memory through said JTAG port.

8. The method of claim 7 wherein said configuration data is stored on a diskette prior to said transferring step.

9. The method of claim 7 wherein said configuration data is generated by a computer software program.

* * * * *